US007005314B2

(12) United States Patent
Ma et al.

(10) Patent No.: US 7,005,314 B2
(45) Date of Patent: Feb. 28, 2006

(54) SACRIFICIAL LAYER TECHNIQUE TO MAKE GAPS IN MEMS APPLICATIONS

(75) Inventors: Qing Ma, San Jose, CA (US); Peng Cheng, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 09/894,334

(22) Filed: Jun. 27, 2001

(65) Prior Publication Data
US 2003/0006468 A1    Jan. 9, 2003

(51) Int. Cl.
   *H01L 21/00*    (2006.01)
(52) U.S. Cl. ............................................ 438/53
(58) Field of Classification Search ............... 307/110; 73/514.32; 361/277; 438/52, 53
See application file for complete search history.

(56) References Cited

U.S. PATENT DOCUMENTS

| 4,918,032 | A | * | 4/1990 | Jain et al. ...................... 438/52 |
| 5,399,415 | A | * | 3/1995 | Chen et al. ................... 428/209 |
| 5,963,788 | A |   | 10/1999 | Barron et al. |
| 6,012,336 | A |   | 1/2000 | Eaton et al. |
| 6,082,197 | A | * | 7/2000 | Mizuno et al. .......... 73/514.32 |
| 6,127,812 | A | * | 10/2000 | Ghezzo et al. ............... 307/110 |
| 6,210,988 | B1 | * | 4/2001 | Howe et al. ................... 438/50 |
| 6,229,684 | B1 | * | 5/2001 | Cowen et al. ............... 361/277 |
| 6,230,566 | B1 | * | 5/2001 | Lee et al. ................. 73/514.32 |
| 6,297,072 | B1 | * | 10/2001 | Tilmans et al. ............. 504/127 |
| 6,329,738 | B1 | * | 12/2001 | Hung et al. .................. 310/309 |
| 6,495,387 | B1 | * | 12/2002 | French .......................... 438/52 |

FOREIGN PATENT DOCUMENTS

| EP | 0928959 A2 | 7/1999 |
| EP | 0947816 A2 | 10/1999 |

OTHER PUBLICATIONS

Nguyen, Clark T.C., "Micromachining technologies for miniaturized communication devices,"SPIE, Sep. 1998, vol. 3511, pp. 24-38.

* cited by examiner

*Primary Examiner*—W. David Coleman
(74) *Attorney, Agent, or Firm*—Blakely, Sokoloff, Taylor & Zafman LLP

(57) ABSTRACT

A method comprising over an area of a substrate, forming a plurality of three dimensional first structures; following forming the first structures, conformally introducing a sacrificial material over the area of the substrate; introducing a second structural material over the sacrificial material; and removing the sacrificial material. An apparatus comprising a first structure on a substrate; and a second structure on the substrate and separated from the first structure by an unfilled gap defined by the thickness of a removed film.

9 Claims, 11 Drawing Sheets

SACRIFICIAL LAYER TECHNIQUE TO MAKE GAPS IN MEMS APPLICATIONS

BACKGROUND

1. Field

The invention relates to microelectromechanical structures (MEMS).

2. Background

Communication systems generally require partitioning of the electromagnetic frequency spectrum. Communication transceiver devices therefore must be capable of high frequency selectivity, i.e., capable of selecting a given frequency band while rejecting all others. Frequency-selective devices, such as filters, oscillators and mixers are therefore some of the most important components within a transceiver and the quality of the devices generally dictates the overall architecture of a given transceiver.

In many communication systems (e.g., cordless and cellular phones), off-chip, passive components are used as part of the frequency-selective devices. Such passive components are typically implemented at the board level and therefore impede the ultimate miniaturization of portable transceivers.

Micromachining technologies have been applied to the miniaturization and integration of frequency-selective devices to bring such devices to the chip level. Polycrystalline silicon-based device structures represent one specific micromachining technology. High frequency (HF) and very high frequency (VHF) vibrating micromechanical resonators, for example, for use in bandpass filters and reference oscillators have been formed through a sequence of integrated circuit-compatible film deposition and patterning. To form small gaps, such as, for example, when fabricating a vibratable resonator, traditional integrated circuit lithography and etch processes may be employed. Such processes typically include depositing and patterning polycrystalline silicon, structural material, the patterning defining gap between device structures through photolithographic means. Potential problems with using traditional lithographic and etch patterning include the gap width miniaturization brought about by the limit associated with lithography and etch. In addition, certain design specifications require near exact symmetric gaps for balance. Such symmetry cannot be guaranteed by lithography and etch processes because the critical dimension (CD) variation is large when approaching the lithography limit. Still further, etching profiles for high aspect ratio gaps can create non-uniform gaps (e.g., vertical gaps) which can give rise to non-uniform charge distribution.

What is needed are methods and structures that are not constrained by the limitations of lithography and etch.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION

A method is described. In one embodiment, the method includes, over an area of a substrate, forming a plurality of three-dimensional first structures. Following the formation of the first structures, the method also includes conformally introducing a sacrificial material over the substrate. A second structural material is then introduced over the sacrificial material followed by the removal of the sacrificial material. The conformal introduction (e.g., deposition) and removal of sacrificial material may be used to form narrow gaps (e.g., on the order of the thickness of the introduced sacrificial material). Accordingly, the method is suitable, in one context, for making microelectromechanical structures (MEMS). further, the gaps may be formed by deposition and removal of sacrificial material without photolithography steps. Therefore, the concerns associated with photolithographically-formed gaps (e.g., continued miniaturization, gap symmetry, CD variation, and gap uniformity) may be reduced.

An apparatus is also described. In one embodiment, the apparatus includes a first structure and a second structure formed on a substrate. The second structure is separated from the first structure by an unfilled gap defined by the thickness of a removed film. In the context of micromechanical or microelectromechanical structures, the apparatus describes a further miniaturization effort of, for example, frequency-selective devices.

Figure 1:
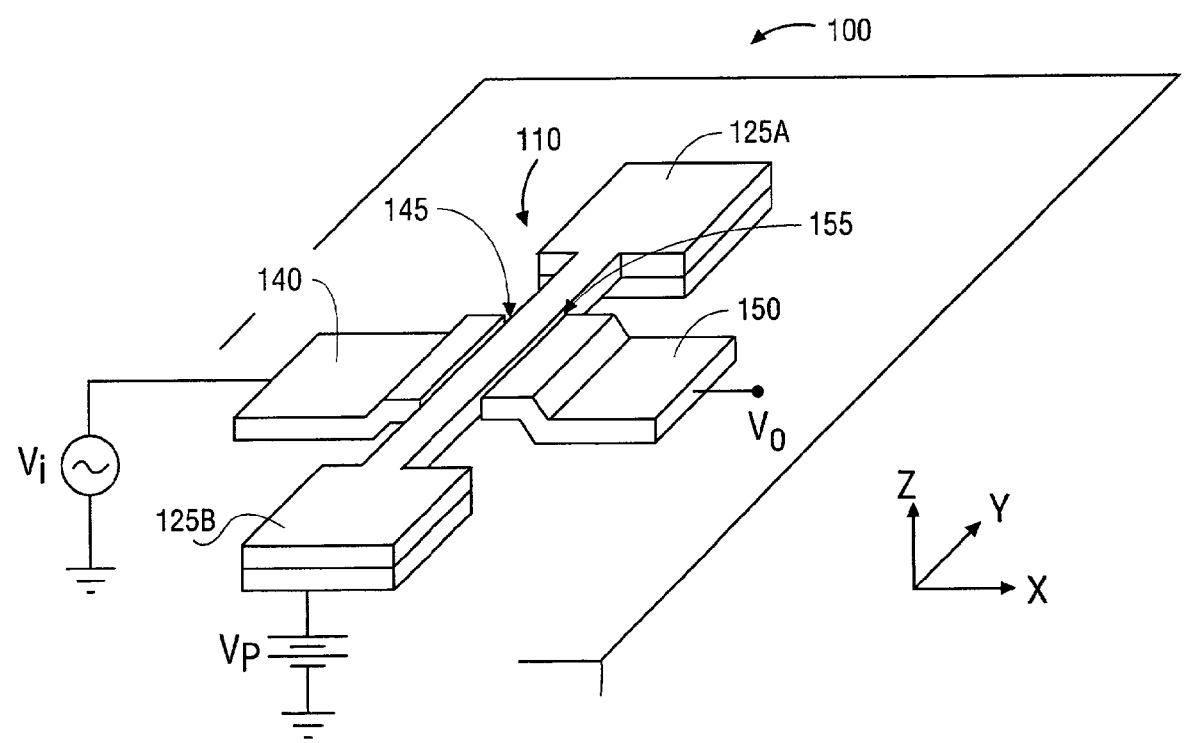
FIG. 1 shows a top perspective schematic view of an embodiment of a resonator structure.

FIG. 1 schematically illustrates a resonator that is used, for example, in a bandpass micromechanical filter. Filter 100 is an example of a typical frequency-selective device for which, in terms of mechanical chip-based structures, very small (narrow), uniform and consistent gaps are desired. Referring to FIG. 1, filter 100 includes beam micromechanical resonator 110. Resonator 110 is coupled at anchors 125A and 125B but is otherwise free-standing. Resonator 110 vibrates parallel to the substrate on which it is formed. The vibrations parallel to the substrate are induced by a lateral gap capacitive transducer. The capacitive transducer is formed by disposing input electrode 140 adjacent resonator 110 with, in this case, gap 145 between input electrode 140 and resonator 110. Output electrode 150 is disposed adjacent resonator 110 with gap 155 between output electrode 150 and resonator 110.

Filter 100 representatively operates in the following manner. An electrical input signal is applied at input electrode 140 and converted to an input force by, in this case, an electromechanical transducer (e.g., an electrical field generating the input force). The electromechanical transducer induces mechanical vibration of free-standing resonator 110 in a z-direction. The mechanical vibration comprises a mechanical signal. If the vibration of resonator 110 is within the passband, the mechanical signal is passed. If the vibration of input resonator 110 is outside the passband of the filter, the mechanical signal is rejected. A passed mechanical signal at resonator 110 is reconverted to electrical energy at an output transducer at output electrode 150 for processing by, for example, subsequent transceiver stages.

The capacitive transduction to convert an electrical signal to a mechanical signal (at input electrode 140) and convert a mechanical signal to an electrical signal (at output electrode 150) is produced in part by gaps 145 and 155, respectively, between the electrodes and resonator 110. The movement of resonator 110 is directly proportional to the input voltage supplied. For on-chip resonators such as resonator 110, one objective is to decrease the input voltage. Decreasing the input voltage generally demands that gap 145 between electrode 140 and resonator 110 be decreased because the force, F, required to cause mechanical movement (e.g., vibration) of resonator 110 is inversely proportional to the gap size for a given voltage:

$$F \propto \frac{1}{gap\ size}.$$

The typical technique to form vertical (zx-direction) gaps for MEMS-type on-chip structures is through photolithographic patterning and etching. Such technique is generally limited to forming gaps on the order of 0.1 microns ($\mu$m). Even at this size, there may be an error or variation as high as 25 percent for a patterned gap which can degrade device performance.

Figure 2:
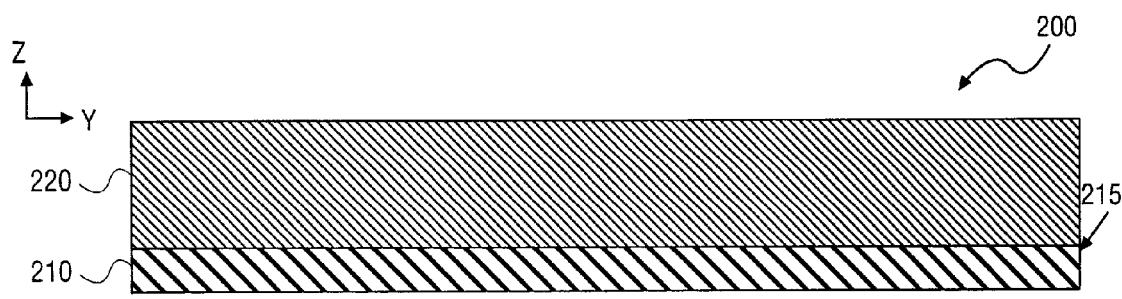
FIG. 2 shows a schematic cross-sectional side view of a portion of a substrate having a first structural material formed thereon in connection with a first example of a method of forming a microelectromechanical structure.

FIGS. 2–8 illustrate a first embodiment of one example of forming vertical (z-direction) and horizontal (y-direction) gaps between structures on a substrate. Referring to FIG. 2, structure 200 presents a portion of a substrate having structural material introduced thereon. Substrate 210 is, for example, a semiconductor substrate such as a silicon substrate suitable as a base structure for MEMS applications. It is appreciated that other substrates, such as glass (including silicon on insulator) and ceramic substrates may be suitable. Substrate 210 may have contact points (pads, terminals) disposed on surface 215 to which device structures (e.g., electrodes, interconnects, etc.) may be formed. Accordingly, substrate 210 may also have conductive traces disposed throughout its body, coupling contact points on the substrate or to another substrate. Substrate 210 may also have one or more device levels, including one or more interconnect levels formed thereon over which structures as described below are formed.

Overlying substrate 210 is first structural material 220. In this embodiment, first structural material 220 is polycrystalline silicon (polysilicon) deposited, for example, by chemical vapor deposition (CVD). A suitable thickness for structure material 220, in this embodiment, is a thickness corresponding to a vertical (z-direction) dimension of a desired MEMS. One example of suitable thickness for first structural material according to current technologies is on the order of 0.5 to 2 microns ($\mu$m).

Figure 3:
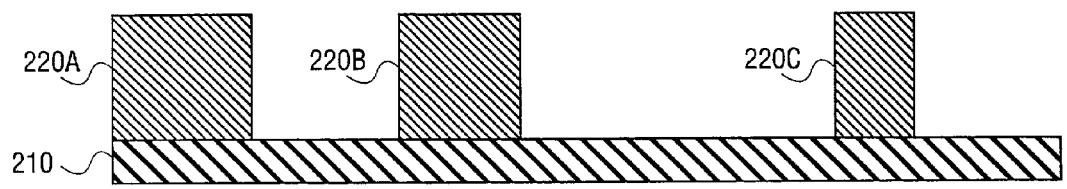
FIG. 3 shows the structure of FIG. 2 after patterning the first structural material.

FIG. 3 shows the structure of FIG. 2 after patterning first structural material into a plurality of discrete structural material portions 220A, 220B, and 220C. Such patterning may be accomplished, for example, through photolithographic techniques (e.g., masking, etching, etc.).

Figure 4:
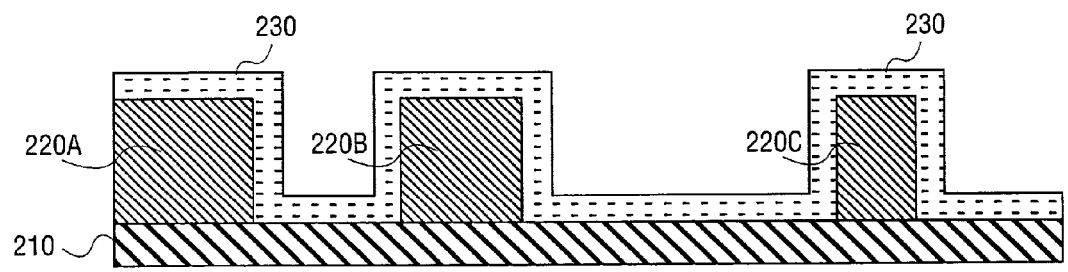
FIG. 4 shows the structure of FIG. 3 after conformally introducing a sacrificial layer over the structure.

FIG. 4 shows the structure of FIG. 3 after the conformal introduction of sacrificial material 230 over the surface of the substrate, including over patterned first structural material portions 220A, 220B, and 220C. In one embodiment, sacrificial material 230 is an oxide, such as silicon dioxide. In the case of silicon dioxide, and where substrate 210 and structural material 220 are silicon, the introduction may be by way of deposition (CVD) or thermal growth. In either case, the introduction of structural material represents, in this example, an introduction to a thickness desired for vertical (z-direction) and horizontal (y-direction) gap dimensions. Suitable thicknesses may be on the order of 50 to 2000 angstroms (Å).

Figure 5:
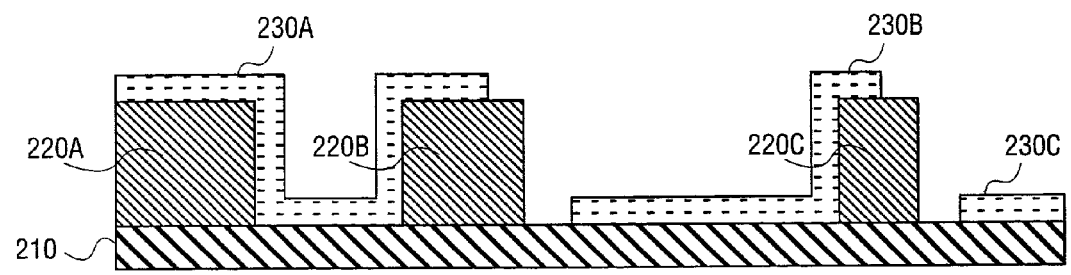
FIG. 5 shows the structure of FIG. 4 after patterning the sacrificial material.

FIG. 5 shows the structure of FIG. 4 following patterning of sacrificial material 230 into sacrificial material portions 230A, 230B, and 230C. Each sacrificial material portion, in this example, has a vertical (z-direction) and a horizontal (y-direction) component corresponding to the vertical and horizontal features of first structural material portions 220A, 220B, and 220C. As noted above, sacrificial material 230 will be used to form vertical and horizontal gaps where desired, for example, in the fabrication of one or more MEMS. Accordingly, the patterning of sacrificial material 230 is based, in part, where it is desired for such gaps to be located on the substrate.

Figure 6:
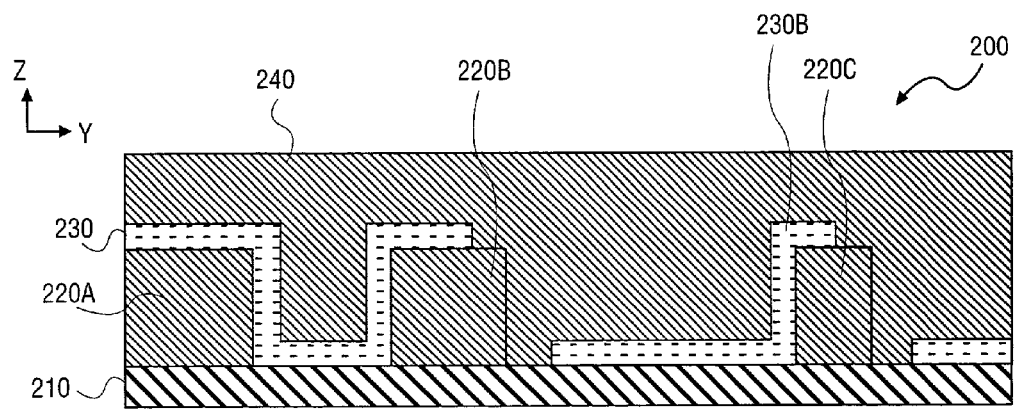
FIG. 6 shows the structure of FIG. 5 after introducing a second structural material over the substrate.

FIG. 6 shows the structure of FIG. 5 following the introduction of second structural material 240. In one example, second structural material 240 is similar to first structural material 220 (e.g., polysilicon). Second structural material is introduced (e.g., deposited (CVD)) to a thickness sufficient to blanket the structure including horizontally disposed components of sacrificial material portion 230A and sacrificial material portion 230B.

Figure 7:
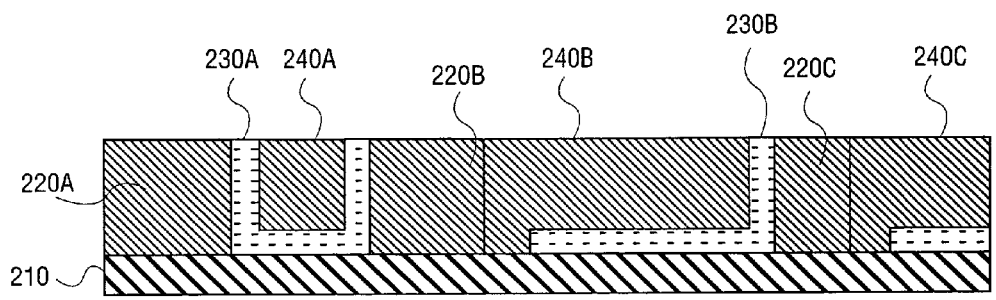
FIG. 7 shows the structure of FIG. 6 after planarizing a surface of the structure.

FIG. 7 shows the structure of FIG. 6 following the planarization of the structure. In one embodiment, the planarization removes sufficient material, e.g., second structural material 240, horizontally-disposed sacrificial material 230, and first structural material 220 to define a vertical (z-direction) dimension for one or more MEMS. Where first structural material 220 is introduced to a thickness corresponding to the thickness of desired device structures, the planarization of the material layers over structure 210 proceeds to first structural material 220 (e.g., the surface of first structural material 220 serving as a stopping point). As illustrated in FIG. 7, the planarization removes the horizontal (y-direction) components of sacrificial material 230 that overlie, in this example, first structural material 220 (see FIG. 6). Second structural material 240 is represented in FIG. 7 as second structural material portions 240A, 240B, and 240C.

Figure 8:
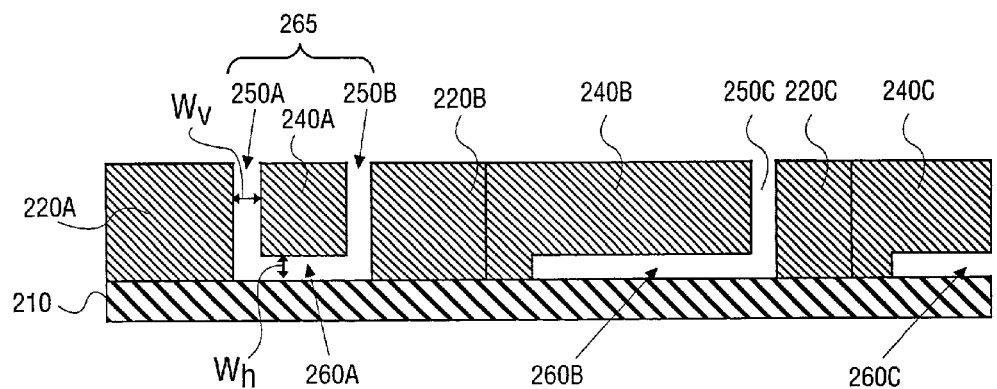
FIG. 8 shows the structure of FIG. 7 after removing the sacrificial layer.

FIG. 8 shows the structure of FIG. 7 following the removal of sacrificial material 230. In the case of a sacrificial material of $SiO_2$, one way sacrificial material 230 is removed is by exposing structure 200 to an acidic solution, such as a solution of hydrofluoric (HF) acid. The removal of sacrificial material 230 forms vertical (z-direction) gaps between device structures of first structural material 220 and second structural material 240 (e.g., gap 250A between first structural material portion 220A and second material portion 240A; gap 250B between second structural material portion 240A and first structural material portion 220B; and gap 250C between second structural material portion 240B and first structural material portion 220C). The removal of sacrificial material 230 also forms horizontal (y-direction) gaps between the structural material and substrate 210 (e.g., gap 260A between second structural material portion 240A and substrate 210; gap 260B between second structural material portion 240B and substrate 210; and gap 260C between second structural material portion 240C and substrate 210).

Referring to FIG. 8, portion 265 is, for example, a portion of a resonator structure, the resonator beam formed of second structural material portion 240A separated from adjacent structural material by vertical (z-direction) gaps 250A and 250B and separated from substrate 210 by horizontal gap 260A. In this example, vertical gap width, $W_v$, of gaps 250A and 250B is equivalent to the height of horizontal gap 260A, $W_h$, because the gaps are defined by the thickness of the conformally introduced sacrificial layer. It is appreciated that the width of the gaps is equivalent to the thickness of sacrificial material 230. Structures 220A and 220B may be coupled or formed on contact points on substrate 210. To act as electrodes, for example, it may be desired to further modify structures 220A and 220B to, for example, decrease the resistivity of the structural material, for example, by introducing a metal to form a silicide of silicon-based structures.

Figure 9:
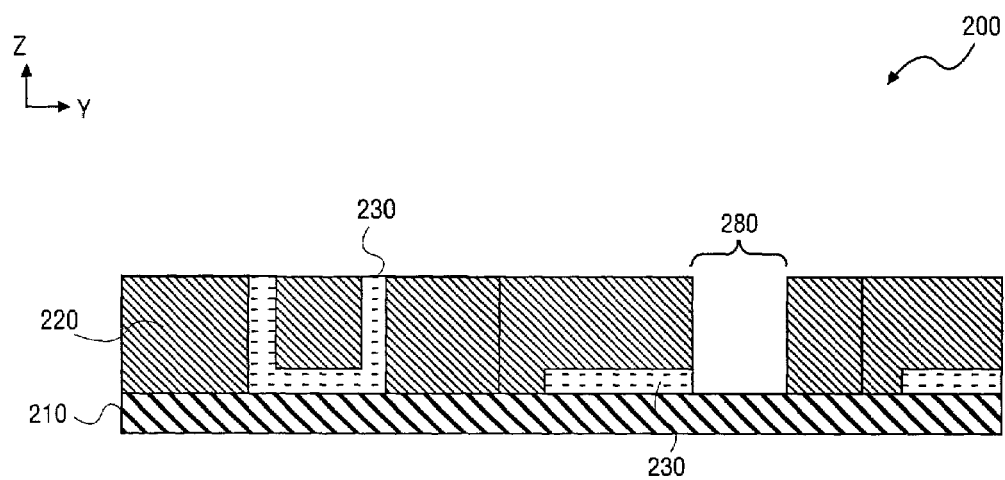
FIG. 9 shows the structure of FIG. 7 after introducing a wide gap according to a second embodiment of the first example.
Figure 10:
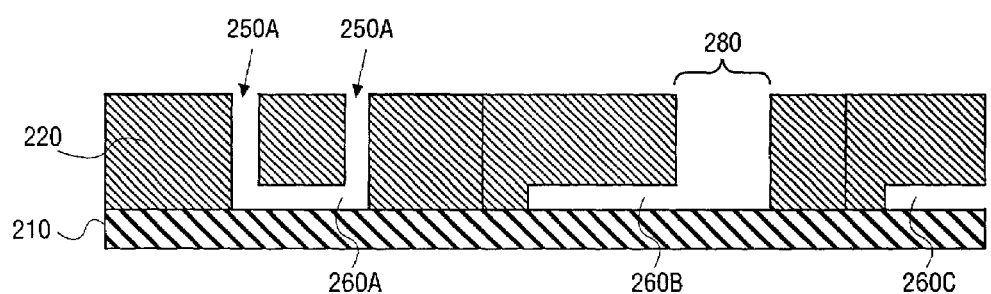
FIG. 10 shows the structure of FIG. 9 after removing the sacrificial layer.

It is appreciated that in addition to the horizontal and vertical gaps defined by the thickness of sacrificial material 230, additional gaps can similarly be formed in the structure defined, for example, by conventional lithographic techniques. FIG. 9 shows the structure of FIG. 7, according to an alternative embodiment of this example, where gap 280 is patterned in the structure by, for example, photolithographic and etch techniques known in the art. FIG. 10 shows the structure of FIG. 9 after the removal of sacrificial material 230. The resulting structure includes vertical gaps 250A and 250B and horizontal gaps 260A, 260B, and 260C defined by the thickness of sacrificial material 230 (vertical gap width, horizontal gap height). FIG. 10 also shows structure with a wider gap 280 formed by photolithographic means.

The above embodiments present a technique of forming structural devices on a substrate suitable, in one instance as structural devices in MEMS applications including, but not limited to, frequency selective devices (e.g., filters, oscillators, etc.). According to such technique, sacrificial layer(s) or film(s) are used to form gaps between structures and/or between structures and the substrate. By utilizing layers or films to define the gap dimensions, the spacing between the structures and/or between structures and the substrate may be minimized, with the spacing determined by the thickness of the sacrificial material layer or film. Also, because the gaps are defined by sacrificial layer or film removal more uniform gap dimensions may be obtained even for narrow (e.g., on the order of 0.1 $\mu$m or less) gaps.

FIGS. 11–18 illustrate one embodiment of a second example of forming structures on a substrate, the structures suitable, in one aspect, for MEMS applications. In this example, a technique for forming vertical (z-direction) and horizontal (y-direction) gaps is described where the vertical gap width is less than the horizontal gap height.

Figure 11:
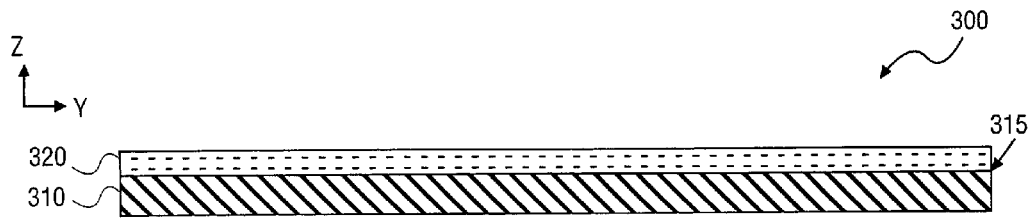
FIG. 11 shows a schematic cross-sectional side view of a portion of a substrate having a sacrificial layer introduced thereon in connection with a second example of forming a microelectromechanical structure.

FIG. 11 shows structure 300 including substrate 310 of, for example, a semiconductor material. As noted above with respect to FIG. 2 and the accompanying text, substrate 310 may have contact points (pads, terminals) disposed on surface 315 to which device structures may be formed, as well as conductive traces disposed throughout its body. Substrate 310 may also have one or more device levels, including interconnect levels, formed thereon.

Overlying substrate 310 in this portion is sacrificial material 320. In one example, sacrificial material 320 is an oxide, such as silicon dioxide ($SiO_2$). In the instance where substrate 310 is silicon, sacrificial material 320 of $SiO_2$ may be introduced either by deposition (e.g., CVD) or thermal growth. Sacrificial material 320 will serve, in this example, to define a portion (less than the entire portion) of a horizontal (y-direction) gap for the structures formed on the substrate. Accordingly, sacrificial material 320 is introduced to a thickness on the order of one to several or more microns, depending on the desired thickness of the ultimate horizontal gap and the contribution to that gap attributable to sacrificial material 320.

Figure 12:
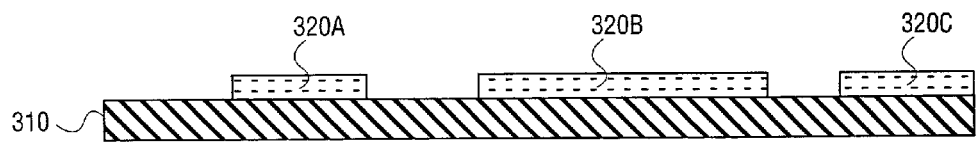
FIG. 12 shows the structure of FIG. 11 after patterning the sacrificial material.

FIG. 12 shows the structure of FIG. 11 after patterning sacrificial material 320 into portions 320A, 320B, and 320C on substrate 310. The dimensions of sacrificial material portions 320A, 320B, and 320C allow for, in this example, the introduction of structural material to the substrate (e.g., to form the anchors of a resonator). Patterning of sacrificial material 320 may be accomplished through photolithographic techniques (mask and etching) as known in the art.

Figure 13:
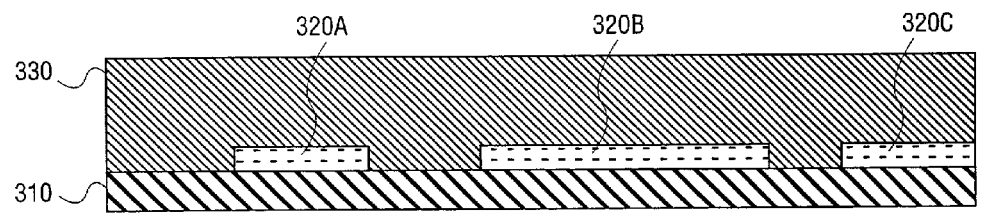
FIG. 13 shows the structure of FIG. 12 after introducing a first structural material over the substrate.

FIG. 13 shows the structure of FIG. 12 after the introduction of first structural material 330 over the substrate. First structural material 330 is introduced conformally and as a blanket layer over the surface of substrate 310 including over sacrificial material portion 320A, 320B, and 320C. In one example, first structure material 330 is polycrystalline semiconductor material (e.g., polysilicon) deposited (e.g., CVD) to at least a thickness desired for a vertical height of the structural material.

Figure 14:
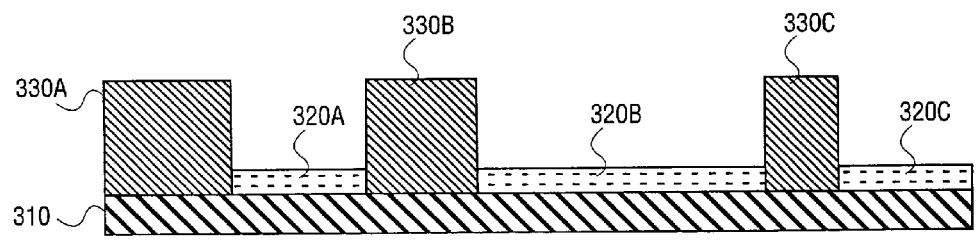
FIG. 14 shows the structure of FIG. 13 after patterning the first structural material.

FIG. 14 shows the structure of FIG. 13 after the patterning of first structural material 330 into first structural material portions 330A, 330B, and 330C. Such patterning may be accomplished by photolithographic techniques (masking and etching) as known in the art to define first structures on substrate 310.

Figure 15:
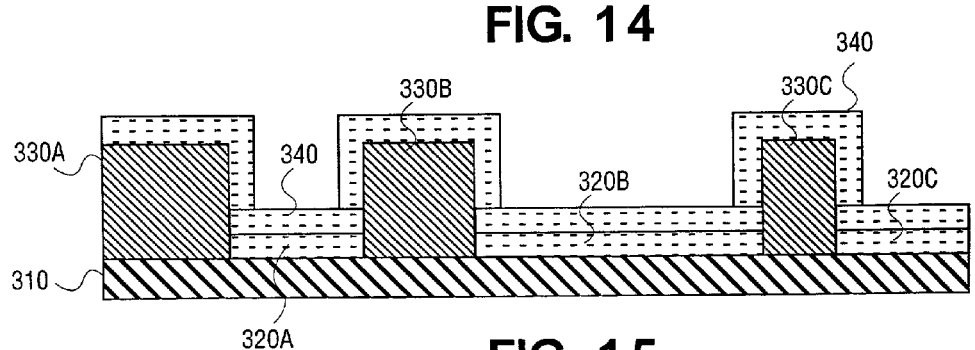
FIG. 15 shows the structure of FIG. 14 after introducing a second sacrificial material over the substrate.

FIG. 15 shows the structure of FIG. 14 after the introduction of second sacrificial material 340 over the substrate. In this example, second sacrificial material 340 is introduced conformally over the surface of the structure, including over first structural material portions 330A, 330B, and 330C as well as over first sacrificial material portions 320A, 320B, and 320C. Where $SiO_2$ is selected as second sacrificial material 340, the introduction of the sacrificial material may be by deposition (CVD) or thermal growth (where first structural material portions 330A, 330B, and 330C are silicon and first sacrificial material portions 320A, 320B, and 320C are also $SiO_2$). The thickness of second sacrificial material 340 will be determined, in one instance, by the vertical gap dimension (width) desired between the ultimate structures. For MEMS applications, a thickness of second sacrificial material 340 will be on the order of one or several monolayers of $SiO_2$.

Figure 16:
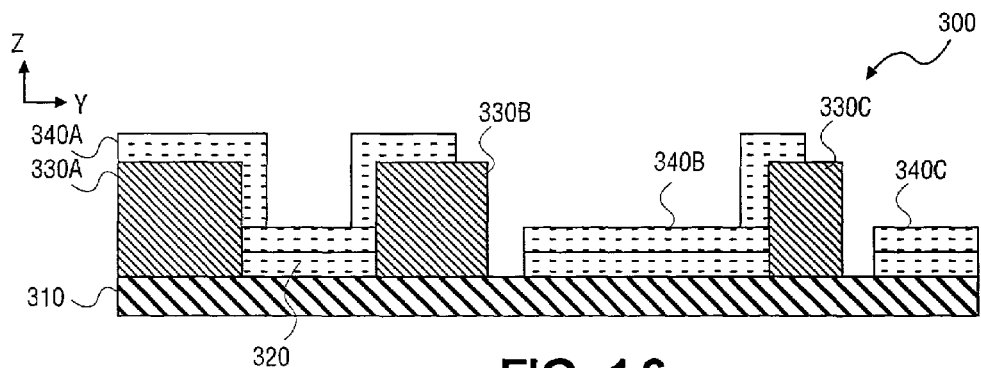
FIG. 16 shows the structure of FIG. 15 after patterning the second sacrificial material.

FIG. 16 shows the structure of FIG. 15 following the patterning of sacrificial material 340 into second sacrificial material portions 340A, 340B, and 340C. Such patterning may be accomplished by photolithographic techniques (mask and etch).

Figure 17:
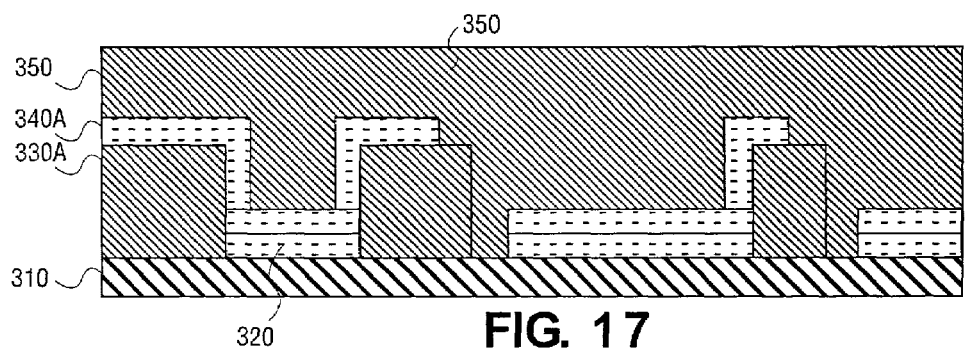
FIG. 17 shows the structure of FIG. 16 after introducing a second structural material over the substrate.

FIG. 17 shows the structure of FIG. 16 after the introduction of second structural material 350. In this example, second structural material 350 is conformally deposited and blanketed over the surface of the structure, including over second sacrificial material portions 340A, 340B, and 340C as well as over first structural material portions 330A, 330B, and 330C. Second structural material 350 may be similar to first structural material 330, such as polysilicon.

Figure 18:
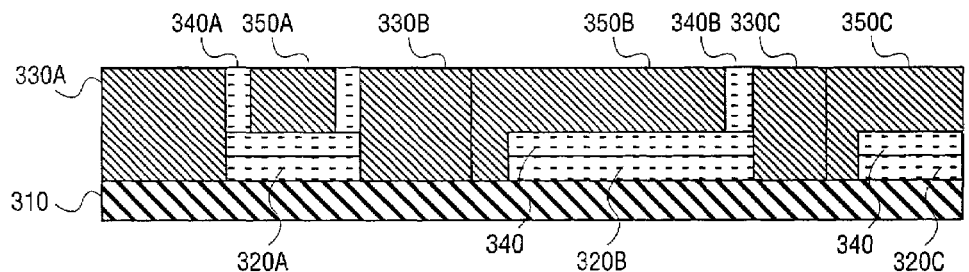
FIG. 18 shows the structure of FIG. 17 after planarizing a surface of the structure.
Figure 19:
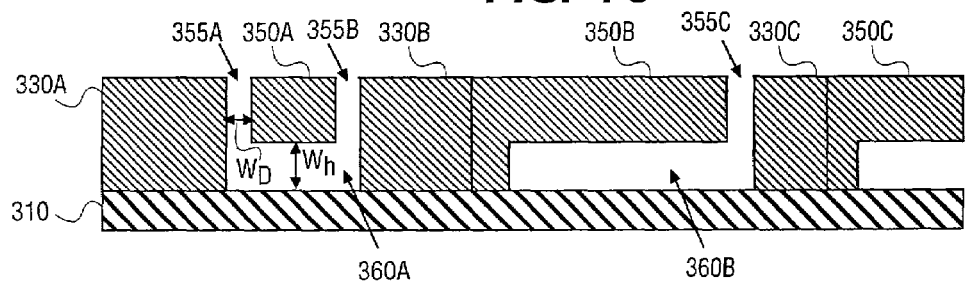
FIG. 19 shows the structure of FIG. 18 after removing the first and second sacrificial materials.

FIG. 18 shows the structure of FIG. 17 following planarizing the structure surface. The planarization may be accomplished by chemical-mechanical polishing (CMP) and is sufficient to remove enough second structural material 350 to remove horizontal portion of second sacrificial material 340 and define a vertical dimension for structures over the substrate (e.g., vertical dimensions for first structural material portions 330A, 330B, and 330C as well as second structural material portions 350A, 350B, and 350C). As illustrated in FIG. 19, following planarization second sacrificial material 340 is exposed at a surface of structure 300.

FIG. 19 shows the structure of FIG. 18 after the removal of second sacrificial material 340 and first sacrificial material 320. In the example where first sacrificial material 320 and second sacrificial material 340 are $SiO_2$, an acid such as hydrofluoric acid may be used to selectively remove the sacrificial material. Once the sacrificial material is removed, various device structures are retained on substrate 310 and are separated from one another, where desired, by vertical (z-direction) gaps. Thus, the structure defined by first structural material portion 330A is separated from the structure defined by second structural material portion 350A by vertical gap 355A; the structure defined by second structural material portion 350A is separated from the structure defined by first structural material portion 330B by vertical gap 355B; and the structure defined by second structural material portion 350B is separated from the structure defined by first structural material portion 330C by gap 355C. Similarly, where desired, the various device structures are separated from substrate 310 by horizontal (y-direction) gaps. Thus, the structure defined by second structural material portion 350A is separated from substrate 310 by gap 360A; and the structure defined by second structural material portion 350B is separated from substrate 310 by gap 360B.

By introducing sacrificial material layers or films (e.g., first sacrificial material 320 and second sacrificial material 340) in a sequential fashion, the vertical gap width, $W_v$, and horizontal gap height, $W_h$, may be formed of different dimensions although each is defined by the thickness of the introduced (deposited) sacrificial layers or films. In other words, the horizontal (y-direction) dimension gap formed on substrate 310 is defined, in this example, by two layers of sacrificial material, while the vertical (z-direction) gap is defined by the thickness of a single sacrificial layer. Accordingly, as illustrated in FIG. 19, the vertical gap width, $W_v$, is less than the horizontal gap height, $W_h$, by an amount equal to the thickness of the first sacrificial material layer or film.

Figure 20:
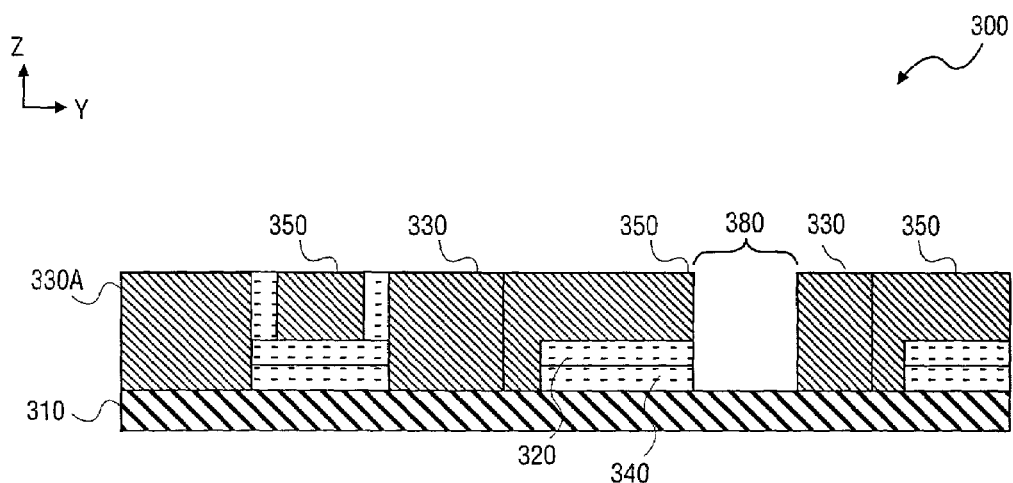
FIG. 20 shows the structure of FIG. 18 after introducing a wide gap according to a second embodiment of forming the structure according to the second example.
Figure 21:
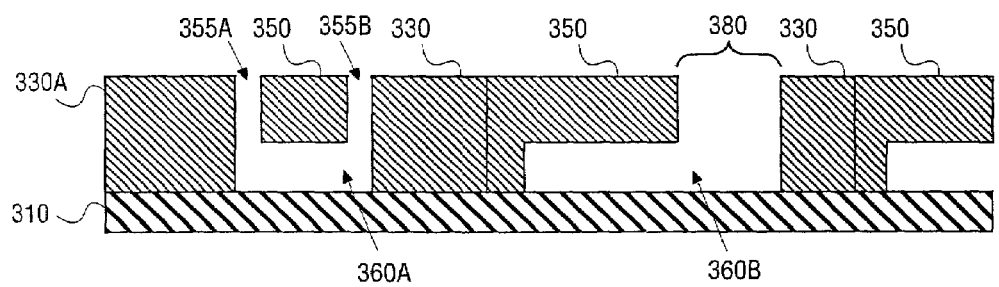
FIG. 21 shows the structure of FIG. 20 after removing the first and second sacrificial materials.

In addition to forming vertical (z-direction) and horizontal (y-direction) gaps between structures and the substrate, respectively, by the layer or film thickness of one or more sacrificial material layers or films, other gaps may be formed by photolithographic techniques. According to a second embodiment of the second example, FIG. 20 shows the structure of FIG. 18 wherein photolithographically formed gap or opening 380 is formed in the structure. Such gap may be formed by photolithographic masking and etching techniques. FIG. 21 shows the structure of FIG. 20 after removal of first sacrificial material 320 and second sacrificial material 340 as described above with reference to FIG. 19 and the accompanying text.

FIGS. 22–30 illustrate one embodiment of a third example of forming structures on a substrate, the structures suitable, in one aspect, for MEMS applications. In this example, a technique for forming vertical (z-direction) and horizontal (y-direction) gaps is described where the vertical gap width is greater than the horizontal gap height.

Figure 22:
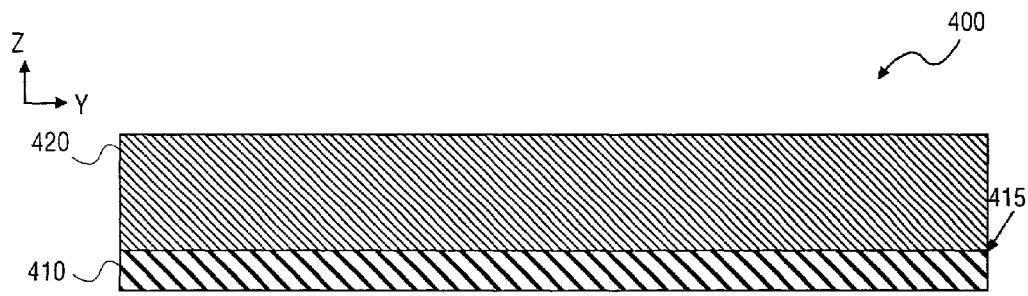
FIG. 22 shows a schematic cross-sectional side view of a portion of a substrate having a first structural material formed thereon according to a third example of forming a microelectromechanical structure.

FIG. 22 shows structure 400 including substrate 410 of, for example, a semiconductor material. As noted above with respect to FIG. 2 and the accompanying text, substrate 410 may have contact point (pads, terminals) disposed on surface 415 to which device structures may be formed, as well as conductive traces disposed throughout its body. Substrate 410 may also have one or more device levels, including interconnect levels, formed thereon.

Overlying substrate 410 in this portion is first structural material 420. In one example, first structural material 420 is polysilicon introduced by CVD.

Figure 23:
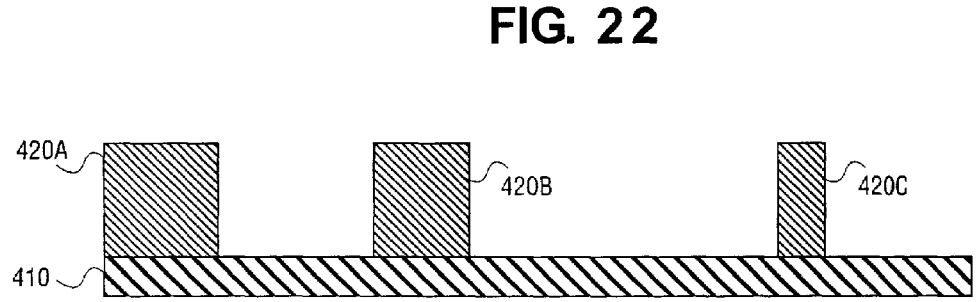
FIG. 23 shows the structure of FIG. 22 after patterning the first structural material.

FIG. 23 shows the structure of FIG. 22 after patterning first structural material 420 into first structural portion 420A, 420B, and 420C. Such patterning may be accomplished by photolithographic mask and etch.

Figure 24:
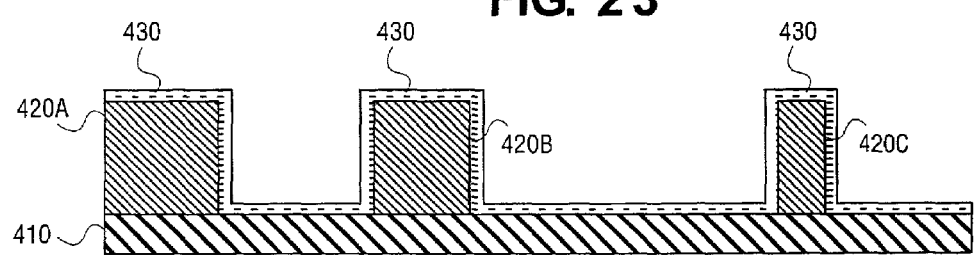
FIG. 24 shows the structure of FIG. 23 after conformally introducing a first sacrificial material over the structure.

FIG. 24 shows the structure of FIG. 23 after the conformal introduction of first sacrificial material 430. In one example, first sacrificial material 430 is an oxide, such as silicon dioxide ($SiO_2$). In the instance where substrate 410 and first structural material portion 420A, 420B, and 420C are each silicon, first sacrificial material 430 of $SiO_2$ may be introduced either by deposition (e.g., CVD) or thermal growth. First sacrificial material 430, in this example, defines a portion (less than the entire portion) of the vertical (z-direction) gaps for the structures formed on the substrate. Accordingly, first sacrificial material 430 is introduced to a thickness on the order of one to several or more monolayers, depending on the desired thickness of the ultimate vertical gaps and the contribution to those gaps attributable to first sacrificial material 430.

Figure 25:
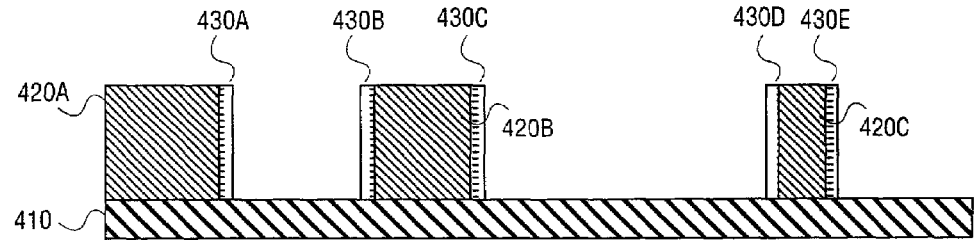
FIG. 25 shows the structure of FIG. 24 after patterning the first structural material.

FIG. 25 shows the structure of FIG. 24 after patterning first sacrificial material 430 into first sacrificial material portion 430A, 430B, 430C, 430D, and 430E on substrate 310. In this example, the first sacrificial material portions conform to the side walls of first structural material portion 420A, 420B, and 420C, respectively. The patterning of first sacrificial material 430 may be accomplished by an anisotropic etch using an etchant favoring, for example, the removal of $SiO_2$ over polysilicon.

Figure 26:
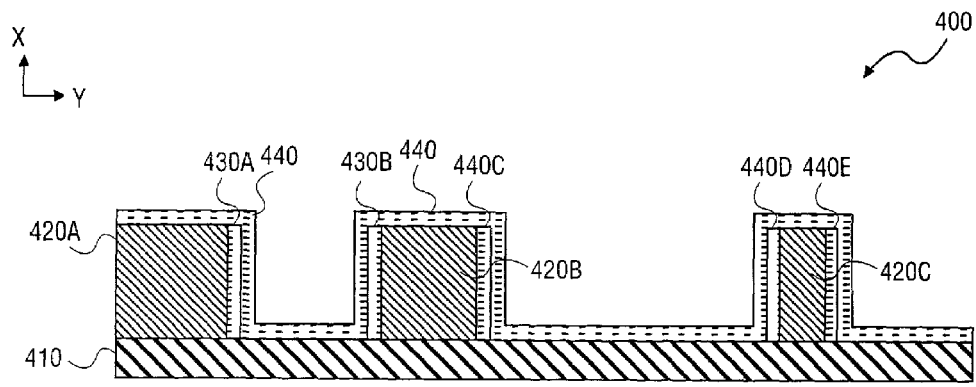
FIG. 26 shows the structure of FIG. 25 after conformally introducing a second sacrificial material over the structure.

FIG. 26 shows the structure of FIG. 25 after the introduction of second sacrificial material 440. Second sacrificial material 440 is conformally introduced over structural material and first sacrificial material portion 430A, 430B, 430C, 430D, and 430E and over first structural material portions 420A, 420B, and 420C (e.g., conformally over the horizontal and vertical components). In one example, second sacrificial material 440 is similar to first sacrificial material 430. In the case of $SiO_2$, second sacrificial material 440 may be introduced by deposition or thermal growth (where substrate 410 and first structural materials 420A, 420B, and 420C are silicon).

Figure 27:
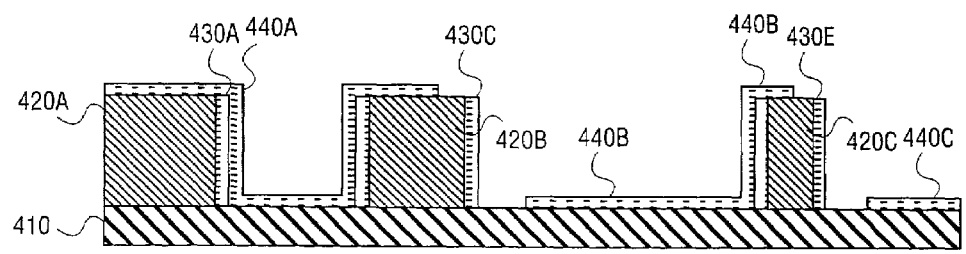
FIG. 27 shows the structure of FIG. 26 after patterning the second sacrificial material.

FIG. 27 shows the structure of FIG. 26 following the patterning of second sacrificial material 440 into second sacrificial material portions 440A and 440B. Such patterning may be accomplished by photolithographic techniques (masking and etching).

Figure 28:
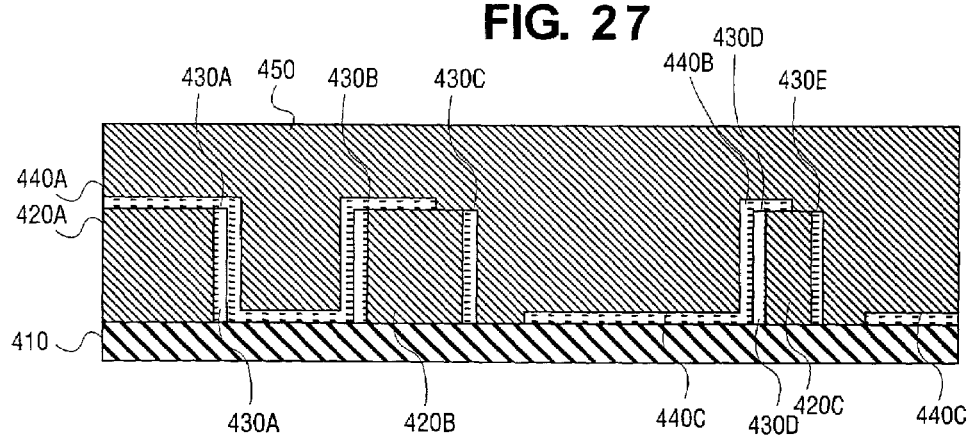
FIG. 28 shows the structure of FIG. 27 after the introducing a second structural material over the structure.

FIG. 28 shows the structure of FIG. 27 after the introduction of second structural material 450. In this example, second structural material 450 is introduced conformally and as a blanket over structure 400, including over second sacrificial material portions 440A and 440B; first structural material portions 420A, 420B, and 420C; and first sacrificial material portions 430C and 430E. Second structural material 450 may be similar to first structural material 420, such as polysilicon.

Figure 29:
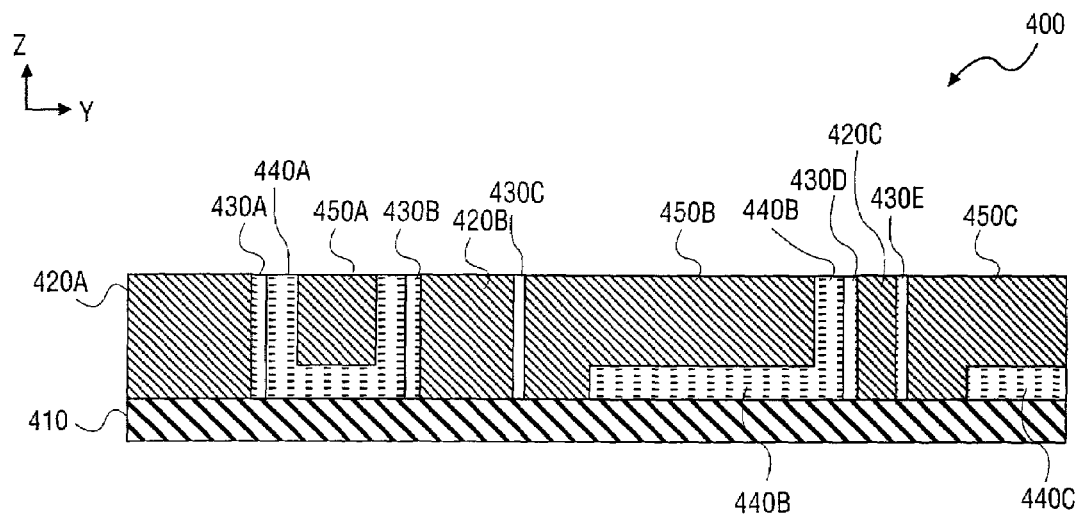
FIG. 29 shows the structure of FIG. 28 after planarizing a surface of the structure.

FIG. 29 shows the structure of FIG. 28 following planarizing of the structure surface. The planarization may be accomplished by chemical-mechanical polishing (CMP) and is sufficient to remove enough second structural material 450 to remove horizontal portions of second sacrificial material portions 440A and 440B and define a vertical dimension for structures over the substrate (e.g., vertical dimensions for first structural material portions 420A, 420B, and 420C). As illustrated in FIG. 29, following planarization, vertical components of second sacrificial material 440A and 440B are exposed at a surface of structure 400 as are first sacrificial material portions 430A, 430B, 430C, 430D, and 430E. The planarization further defines second structural material portions 440A, 440B, and 440C.

Figure 30:
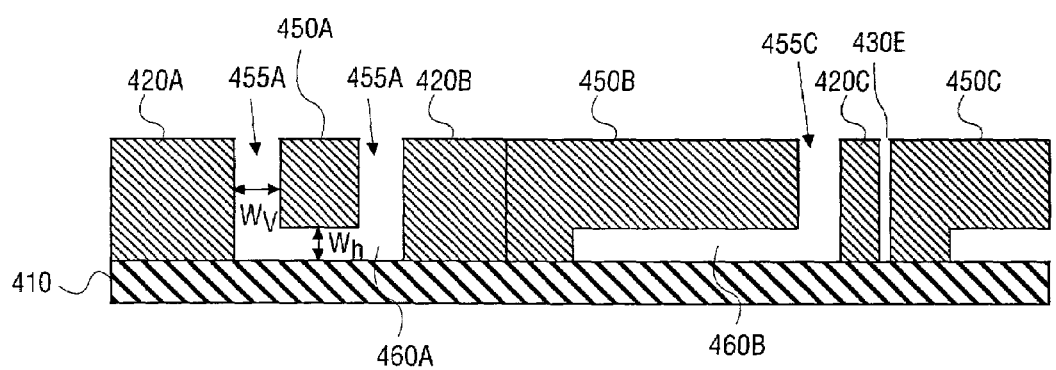
FIG. 30 shows the structure of FIG. 29 after removing the first and second sacrificial materials.

FIG. 30 shows the structure of FIG. 29 after the removal of second sacrificial material 440 and first sacrificial material 430. In one example, where first sacrificial material 430 and second sacrificial material 440 are silicon dioxide, an acid such as hydrofluoric (HF) acid may be used to selectively remove the sacrificial material. Once the sacrificial material is removed, various device structures are retained on substrate 410 and separated from one another by vertical (z-direction) gaps. Thus, the structure defined by first structural material portion 420A is separated from the structure defined by second structural material portion 450A by vertical gap 455A; the structure defined by second structural material portion 450A is separated form the structure defined by first structural material portion 420B by vertical gap 455B; and the structure defined by second structural material portion 450B is separated from the structure defined by first structural material portion 420C by vertical gap 455C. Similarly, where desired, various device structures are separated from substrate 410 by horizontal (y-direction) gaps. Thus, the structure defined by second structural material portion 450A is separated from substrate 410 by gap 460A; and the structure defined by second structural material portion 450B is separated from substrate 410 by gap 460B.

By introducing sacrificial material layers or films (e.g., first sacrificial material 430 and second sacrificial material 440) in a sequential fashion, the vertical gap width, $W_v$, and horizontal gap height, $W_h$, may be formed of different dimensions although each is defined by the thickness of the introduced (deposited) sacrificial layers or films. In other words, the horizontal (z-direction) gap formed on substrate 410 is defined by, in this example, a single layer of sacrificial material, while the vertical (v-direction) gap is defined by a thickness of two layers of sacrificial material. Accordingly, as illustrated in FIG. 30, the vertical gap width, $W_v$, is greater than the horizontal gap height, $W_h$, by an amount equal to the thickness of the first sacrificial material layer or film.

Figure 31:
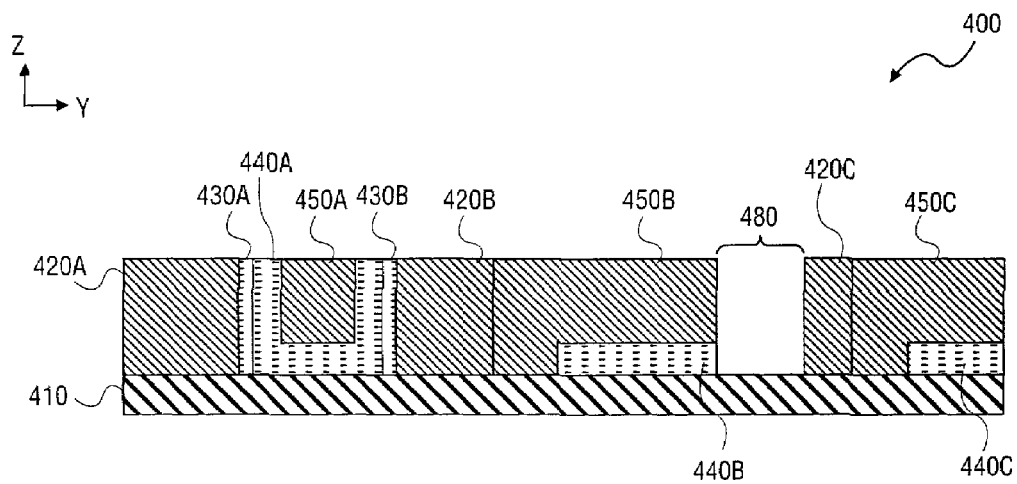
FIG. 31 shows the structure of FIG. 28 after introducing a wide gap according to a second embodiment of the third example.
Figure 32:
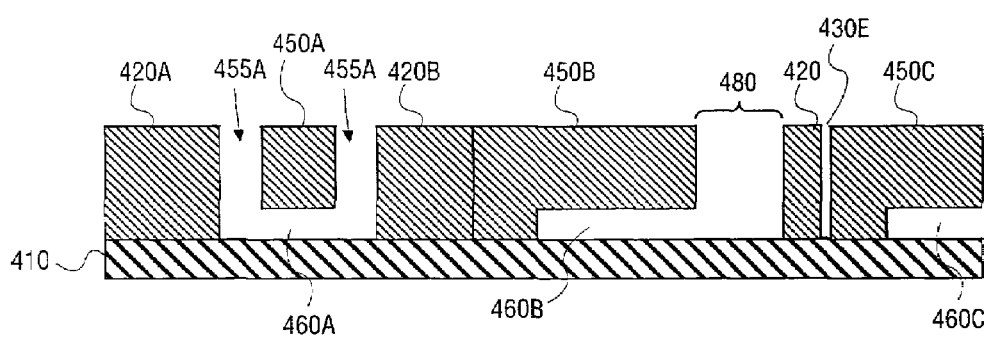
FIG. 32 shows the structure of FIG. 31 after removing the first and second sacrificial materials.

In addition to forming vertical (z-direction) and horizontal (y-direction) gaps between structures and the substrate, respectively, by the layer or film thickness of one or more sacrificial material layers or films, other gaps may be formed by conventional photolithographic techniques. According to a second embodiment of the third example, FIG. 31 shows the structure of FIG. 29 wherein a photolithographically-formed gap or opening 480 is formed in the structure. Such gap may be formed by conventional masking and etching techniques as known in the art. FIG. 32 shows the structure of FIG. 31 after removal of first sacrificial material 430 and second sacrificial material 440 as described above with reference to FIG. 30 and the accompanying text.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising: over an area of a substrate, forming a plurality of three dimensional first structures each including lateral side portions defining a thickness of the plurality of first structures and a distance from the surface of the substrate;

following forming the plurality of first structures, conformally introducing a sacrificial material over the area of the substrate including on the lateral side portions of the plurality of first structures;

introducing a second structural material over the sacrificial material;

after introducing the second structural material, exposing a portion of the sacrificial material and a surface of the plurality of first structures, the surface opposing the surface of the substrate; and removing the sacrificial material, wherein removing the sacrificial material comprises suspending the second structural material as a second structure electrically coupled to the first structure.

2. The method of claim 1, wherein exposing a portion of the sacrificial material comprises removing a portion of the second structural material.

3. The method of claim 1, prior to introducing the second structural material, further comprising patterning the sacrificial material.

4. The method of claim 1, wherein the first structural material comprises silicon and the sacrificial material comprises silicon dioxide and introducing the sacrificial material comprises growing.

5. The method of claim 1, wherein patterning the first structures defines a plurality of first areas of the portion of the substrate occupied by the first structures and at least a second area of the portion of the substrate free of the first structures, and introducing the sacrificial material comprises introducing the sacrificial material at least over the second area.

6. A method comprising:
   over an area of a surface of a substrate, lithographically patterning a plurality of first structures each including lateral side portions defining a thickness of the plurality of first structures and a distance from the surface of the substrate, the plurality of first structures having a first dimension about the surface of the substrate and a second different dimension;

following forming the plurality of first structures, conformally introducing a sacrificial material layer over the area of the substrate including on the lateral side portions of the plurality of first structures;

patterning the sacrificial material to expose surface of the plurality of first structures, the surface opposing the surface of the substrate;

forming second structures over the sacrificial material; and removing the sacrificial material, wherein removing the sacrificial material comprises suspending the second structure by the first structure, and wherein the second structure is electrically coupled to the first structure.

7. The method of claim 6, prior to removing the sacrificial material, further comprising exposing a portion of the sacrificial material.

8. The method of claim 7, wherein exposing a portion of the sacrificial material comprises removing a portion of the second structural material.

9. The method of claim 6, wherein the sacrificial material comprises silicon dioxide and introducing the sacrificial material comprises growing.

* * * * *